United States Patent
Hall et al.

(10) Patent No.: US 6,484,288 B1
(45) Date of Patent: Nov. 19, 2002

(54) STATISTICS SIGNATURE GENERATION AND ANALYSIS

(75) Inventors: Christopher J. Hall, Northampton (GB); Robert J. Harrison, San Jose, CA (US); Anthony S. Rowell, Northamptonshire (GB); Amarjit S. Bhandal, Northampton (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/466,039

(22) Filed: Dec. 17, 1999

(51) Int. Cl.[7] ............................................. H03M 13/09
(52) U.S. Cl. ...................................................... 714/807
(58) Field of Search ......................................... 714/807

(56) References Cited

U.S. PATENT DOCUMENTS

| | | | | |
|---|---|---|---|---|
| 4,185,269 A | * | 1/1980 | Hodges et al. ............... | 714/762 |
| 5,550,803 A | * | 8/1996 | Crayford et al. ............ | 370/246 |
| 5,619,516 A | * | 4/1997 | Li et al. ...................... | 714/757 |
| 5,724,368 A | | 3/1998 | Zook .......................... | 371/37.7 |
| 6,085,253 A | * | 7/2000 | Blackwell et al. ........... | 709/235 |
| 6,272,144 B1 | * | 8/2001 | Berenbaum et al. ......... | 370/419 |
| 6,336,900 B1 | * | 1/2002 | Alleckson et al. ........... | 128/904 |

FOREIGN PATENT DOCUMENTS

| | | |
|---|---|---|
| EP | 0 376 486 | 7/1990 |
| EP | 0 767 539 | 4/1997 |
| EP | 0 786 883 | 7/1997 |
| WO | 94/15407 | 7/1994 |
| WO | 95/15522 | 6/1995 |

* cited by examiner

*Primary Examiner*—Stephen M. Baker
(74) *Attorney, Agent, or Firm*—Dana L. Burton; W. James Brady; Frederick J. Telecky, Jr.

(57) ABSTRACT

The present invention provides for a statistics Cyclic Redundancy Check (CRC) (108) wherein the statistics CRC (108) is representative of the values contained within a statistics RAM (110). The statistics CRC (108) is then used to reduce test vectors by allowing the validity of the statistics to be determined by reading this signature instead of reading all the individual statistics. The signature is regenerated for each complete pass of the statistics, and the contents of this register are only updated when the pass is complete.

11 Claims, 1 Drawing Sheet

STATISTICS SIGNATURE GENERATION AND ANALYSIS

TECHNICAL FIELD OF THE INVENTION

This invention relates generally to statistical analysis and more particularly to improved methods of storing and analyzing statistics.

BACKGROUND OF THE INVENTION

The generation and analysis of statistics is useful to track and test the performance of many processes. In certain systems, however, the amount of statistics needed becomes cumbersome in that the amount of time it takes to manipulate the data and the amount of memory needed to store the data increases. One particular application where this is true is in the generation, storage and manipulation of network statistics.

Thus, there is a need for a method and system of managing large amounts of statistical data.

SUMMARY OF THE INVENTION

The present invention provides for a statistics Cyclic Redundancy Check (CRC) wherein the statistics CRC is representative of the values contained within the statistics RAM. The statistics CRC is then used to reduce test vectors by allowing the validity of the statistics to be determined by reading this signature instead of reading all the individual statistics. The signature is regenerated for each complete pass of the statistics, and the contents of this register are only updated when the pass is complete.

These and other features of the invention that will be apparent to those skilled in the art from the following detailed description of the invention, taken together with the accompanying drawings.

DETAILED DESCRIPTION OF THE INVENTION

The present invention provides for a statistics Cyclic Redundancy Check (CRC) wherein the statistics CRC is representative of the values contained within the statistics RAM. The statistics CRC is then used to reduce test vectors by allowing the validity of the statistics to be determined by reading this signature instead of reading all the individual statistics. The signature is regenerated for each complete pass of the statistics, and the contents of this register are only updated when the pass is complete. This statistics CRC is thus a signature which can be used to represent the data from which it was generated.

Figure 1:
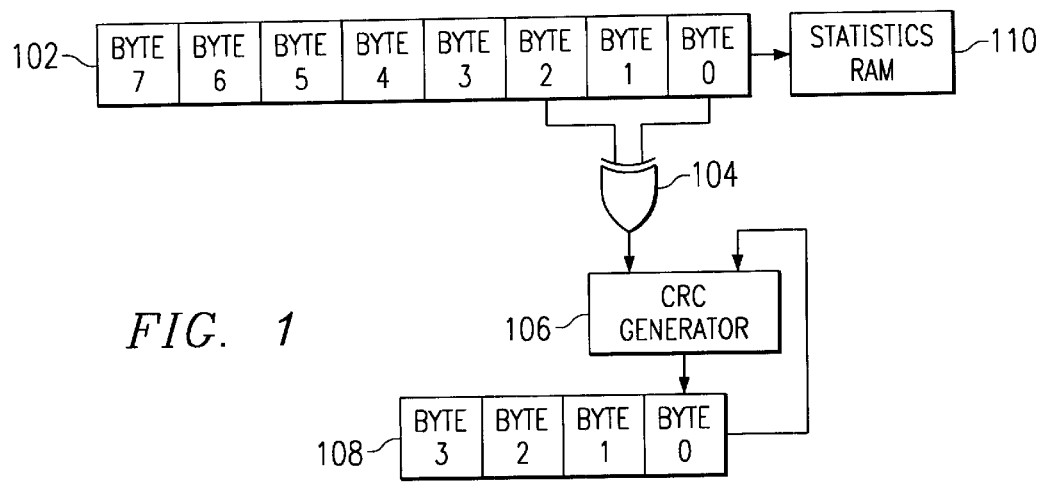
FIG. 1 is a block diagram of a system for statistics CRC signature generation in accordance with the present invention.

One embodiment of the present invention is shown in FIG. 1. Each time a 64-bit statistic 102 is modified and written back to the Statistics RAM 110 16 bits, i.e., bytes 0 and 2, of the 64-bit statistic 102 are exclusived or'd together in XOR 104. The 8-bit result is fed into one input of the CRC generator 106. While bytes 0 and 2 are exlcusive or'd together in the first clock cycle, bytes 1 and 3, bytes 4 and 6, and bytes 5 and 7 are exclusive or'd together during subsequent clock cycles. The second input of the CRC generator 106 is fed from the CRC signature register 108. CRC signature register 108 is a rolling 32-bit register which holds each resulting CRC signature. The CRC generator 106 uses the two 8-bit inputs to generate a new low order byte in the CRC signature register 108. At predetermined intervals, the resulting CRC signature is stored in the statistics RAM 110 along with the data that the CRC signature represents.

Figure 2:
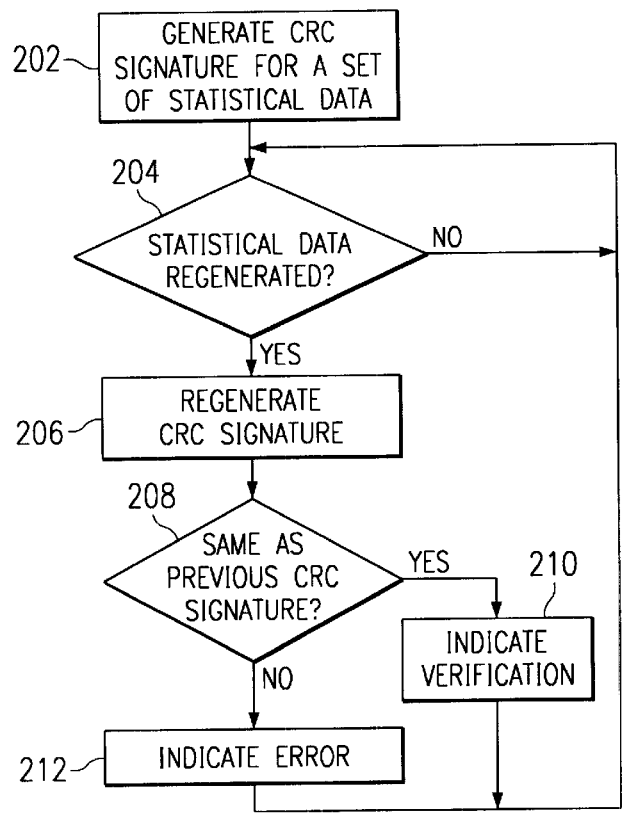
FIG. 2 is a flow diagram illustrating use of the CRC signature generated in accordance with the present invention.

FIG. 2 shows a flow diagram illustrating use of the CRC signature generated in accordance with the present invention. At block 202, a CRC signature is generated for a set of statistical data. At decision block 204, if the statistical data if regenerated, then processing continues at block 206 where the CRC signature is accordingly regenerated. Otherwise, processing continues at decision block 204. After processing at block 206, processing continues at decision block 208 where the regenerated CRC signature is compared with the previous CRC signature generated for the set of statistical data. If, at decision block 208 the CRC signatures are the same, processing continues at block 210 where a signal indicating verification of the statistical data is generated. Otherwise processing continues at block 213 where a signal indication an error in the statistical data is generated instead.

OTHER EMBODIMENTS

Although the present invention and its advantages have been described in detail, it should ,be understood that various changes, substitutions and alterations can be made herein without departing from the spirit and scope of the invention as defined by the appended claims.

What is claimed is:

1. A method of forming a Cyclic Redundancy Check (CRC) signature comprising the steps of:

a. forming a first input by generating the exclusive-or of bytes 0 and 2 of a first data string;

b. inputting the first input to a CRC generator;

c. inputting a second input from a CRC signature register to the CRC generator;

d. processing the first and second input in the CRC generator to generate a first output; and e. outputting the first output to a low order byte of the CRC signature register.

2. The method of claim 1 wherein the CRC signature register is a rolling register.

3. The method of claim 1 wherein the method is repeated using subsequent bytes of the first data string to form the first input until all bytes of the first data string are used to form the CRC signature.

4. The method of claim 1 further comprising the steps of:

a. forming a third input by generating the exclusive-or of bytes 1 and 3 of the first data string;

b. inputting the third input to the CRC generator;

c. inputting a fourth input from the CRC signature register to the CRC generator;

d. processing the third and fourth input in the CRC generator to generate a second output; and e. outputting the second output to a low order byte of the CRC signature register.

5. The method of claim 4 further comprising the steps of:

a. forming a fifth input by generating the exclusive-or of bytes 4 and 6 of the first data string;

b. inputting the fifth input to the CRC generator;

c. inputting a sixth input from the CRC signature register to the CRC generator;
d. processing the fifth and sixth input in the CRC generator to generate a third output; and
e. outputting the third output to a low order byte of the CRC signature register.

6. The method of claim 5 further comprising the steps of:
a. forming a seventh input by generating the exclusive-or of bytes 5 and 7 of the first data string;
b. inputting the seventh input to the CRC generator;
c. inputting an eighth input from the CRC signature register to the CRC generator;
d. processing the seventh and eighth input in the CRC generator to generate a fourth output; and
e. outputting the fourth output to a low order byte of the CRC signature register.

7. The method of claim 1 further comprising the step of storing the contents of the CRC signature register to a data storage device.

8. The method of claim 7 wherein the storing is done at predetermined intervals.

9. The method of claim 7 wherein a plurality of data strings are processed to form the CRC signature in the CRC signature register prior to storing the contents of the CRC signature register to the data storage device.

10. The method of claim 9 wherein the multiple data strings and the CRC signature are stored in a RAM.

11. The method of claim 10 wherein the plurality of data strings are statistical data.

* * * * *